(12) United States Patent
Okamura et al.

(10) Patent No.: US 6,348,418 B1
(45) Date of Patent: Feb. 19, 2002

(54) METHOD OF FORMING PHOTORESIST PATTERN

(75) Inventors: Kenji Okamura; Hiromi Arata; Shuichi Inoue, all of Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/239,998

(22) Filed: Jan. 29, 1999

(30) Foreign Application Priority Data

Jan. 29, 1998 (JP) ............................................ 10-017064

(51) Int. Cl.$^7$ ............................................ H01L 21/302
(52) U.S. Cl. ..................... 438/721; 438/669; 438/705; 438/734; 438/974
(58) Field of Search ................................ 438/669, 683, 438/721, 705, 734, 780, 948, 904, 974; 430/318

(56) References Cited

U.S. PATENT DOCUMENTS

| | | | |
|---|---|---|---|
| 4,330,569 A | * | 5/1982 | Gulett et al. |
| 5,702,767 A | * | 12/1997 | Peterson et al. |
| 5,756,394 A | * | 5/1998 | Manning |
| 5,907,784 A | * | 5/1999 | Larson |
| 5,998,103 A | * | 12/1999 | Zhang |
| 6,090,522 A | * | 7/2000 | Yamana |

FOREIGN PATENT DOCUMENTS

| | | |
|---|---|---|
| JP | 3-116852 | 5/1991 |
| JP | 8045907 A | 2/1996 |
| JP | 10214773 | 8/1998 |

* cited by examiner

*Primary Examiner*—George Fourson
*Assistant Examiner*—Michelle Estrada
(74) *Attorney, Agent, or Firm*—Foley & Lardner

(57) ABSTRACT

A tungsten silicide (WSi) film is formed of tungsten hexafluoride ($WF_6$) and dichlorosilane ($SiCl_2$) as main raw material on a polysilicon film by the CVD method. At the final stage of this film forming process, supply of tungsten hexafluoride is terminated to relax internal stresses. As a result, on the tungsten silicide film, an Si-rich tungsten silicide film containing chlorine ions in a high concentration is formed. Then, before coating a chemical amplification photoresist, these films along with a silicon substrate are soaked in an etching liquid containing hydrogen peroxide to remove the Si-rich tungsten silicide film so that generation of ammonia chloride, which suppresses an alkali developing action, can be controlled. Thus the tungsten silicide film can be patterned by photolithography without pattern defects.

6 Claims, 4 Drawing Sheets

- 15 ; Si-rich tungsten silicide film
- 14 ; tungsten silicide film
- 13 ; polysilicon film
- 12 ; silicon oxide film
- 11 ; silicon substrate

- 14 ; tungsten silicide film
- 13 ; polysilicon film
- 12
- 11

- 17 ; chemical amplification photoresist
- 14 ; tungsten silicide film

- 18 ; photoresist pattern
- 14 ; tungsten silicide film distribution of photoresist pattern defects
according to conventional method distribution of photoresist pattern defects
according to method of first embodiment

METHOD OF FORMING PHOTORESIST PATTERN

BACKGROUND OF THE INVENTION

1. Field of the Invention

The present invention relates to a photoresist pattern forming method, and more particularly to a method of forming a photoresist pattern on a silicide film (of an interconnect metal compound of silicon and a metal element).

2. Description of the Related Art

In the manufacture of transistors and other semiconductor devices, it has been customary to use tungsten silicide (WSi) as conductive material for gate electrodes and wirings. The conventional method for formation of this tungsten silicide film is exemplified by chemical vapor deposition (CVD) and sputtering; with recent progress in miniturization of semiconductor integrated circuits, chemical vapor deposition is increasingly becoming more popular than sputtering as a tungsten silicide film whose resistivity is lower by approximately 20%–40% can be obtained.

Conventionally, in the photolithographic process for the tungsten silicide film formed by CVD, using grays (436 nm in wavelength) and i rays (365 nm in wavelength) of a high-voltage mercury lamp as a light source, exposure takes place over a novolak-based photoresist coated and solidified on the tungsten silicide film to form a photoresist pattern. Recently, however, the design requirement for semiconductor integrated circuits has come down below 35 nm. In an effort to obtain a preciser photoresist pattern to meet such design criterion, exposure using a krypton fluoride (KrF) excimer laser as a light source (248 nm in wavelength) is realized. In this exposure using KrF excimer laser, it has become practical to use a chemical amplification photoresist instead of the novolak-based photoresist, which is too large in light absorption to obtain a good resist pattern.

A chemical amplification photoresist is a positive photoresist to which an acid catalyst reaction is applied. The positive photoresist is generally composed of a base resin, such as polyhydroxystyrene, which is to be insoluble with an alkali developing liquid when the protection radical is in a bonded state at a predetermined portion and to be soluble with the alkali developing liquid when the radical is in a free state, a photoionizer, which emits hydrogen ions upon exposure to light, a small mass of additive for controlling the performance, and an organic solvent for spinner-coating.

When this chemical amplification photoresist coated on the tungsten silicide film and dried to become solid is exposed to irradiation of far ultraviolet rays as of a KrF excimer layer light source, hydrogen ions are generated from the photoionizer to start chemical amplification. When the hydrogen ions are bonded with the base resin in place of the protection radical of the base resin during post exposure baking (PEB), the base resin will be soluble with the alkali developing liquid. In the meantime, the freed protection radical will also reacts with water to generate hydrogen ions again so that the above-mentioned dissolving with the alkali developing liquid will be expedited in chain reaction.

Therefore, if the positive chemical amplification photoresist is developed by the alkali developing liquid, a desired photoresist pattern can be obtained even with insufficient exposure.

The manner in which the chemical amplification photoresist is patterned according to the conventional phtolithographic process will now be described in further detail with reference to FIGS. 3(a) through 3(c) of the accompanying drawings.

Firstly, a silicon oxide film 32 is formed on the surface of a silicon substrate (wafer) 31 as by thermal oxidation. Then a polysilicon film 33 is grown on the silicon oxide film 32 as by CVD. Subsequently, a tungsten silicide (WSi) film 34 is formed by CVD using dichlorosilane ($SiH_2Cl_2$) and tungsten hexafluoride ($WF_6$) as raw material (FIG. 3(a)). However, since this tungsten silicide film 34 is very large in internal stress, it is necessary to terminate supplying tungsten hexafluoride, namely, to supply only dichlorosilane at the final stage of such film forming process to intend a reduced stress.

Then, in order to increase adhesion of the photoresist, the semiconductor substrate is exposed to hexamethyldisilazane (HMDS) atmosphere to make the substrate surface hydrophobic. Subsequently, an Si-rich tungsten silicide film 35 is coated with a chemical amplification photoresist 37 (FIG. 3(b)). Then, pattern exposure takes place using KrF excimer laser, for example, as a light source, and finally, only unnecessary portions of the photoresist are removed to form a photoresist pattern 38 (FIG. 3(c)).

However, this conventional photoresist pattern forming method has the following problems:

As is mentioned above, in order to relax internal stresses of the tungsten silicide film 34, at the final stage of formation of the film, supply of tungsten hexafluoride is terminated, namely, only dichlorosilane is continued to be supplied. Even during this final stage, the tungsten silicide film 34 is slightly formed as an Si-rich tungsten silicide film 35 containing silicon excessively (FIG. 3(a)).

This Si-rich tungsten silicide film 35 contains also a high-concentration of chlorine originating from dichlorosilane. Therefore, as is mentioned above, during the surface treatment of the Si-rich tungsten silicide film 35 with hexamethyldisilazane (HMDS) prior to the coating of the chemical amplification resist 37, a chemical reaction occurs between ammonia generated from hexamethyldisilazane and chlorine coming from the uppermost layer of the Si-rich tungsten silicide film 35 to form a solid 36 of ammonium chloride ($NH_4Cl$) as shown in FIG. 4(a).

If the chemical amplification resist 37 is coated to the resulting surface of the Si-rich tungsten silicide film 35 and solidified there (FIG. 4(b)) and then exposure by far ultraviolet rays from a light source as of KrF excimer laser takes place, hydrogen ions serving as a seed to start chemical amplification are generated from the photoionizer in the chemical amplification photoresist and are captured by the solid 36 of ammonium chloride so that chain reaction of release of the protection radical will be obstructed. As a result, the chemical amplification photoresist around the solid 36 of ammonium chloride will be free from so decomposing as to be soluble with alkali. Therefore, during the developing, the photoresist to be removed remains unremoved as pattern defects 39 (FIG. 4(c)); even if the tungsten silicide film 34 is etched in the presence of these pattern defects 39, precise gate electrodes and wirings as designed cannot be achieved, which might result in products defective yet in electrical property.

SUMMARY OF THE INVENTION

With the foregoing prior art problems in view, it is an object of the present invention to provide a method of forming a photoresist pattern without causing pattern defects while a metal silicide film formed on a substrate, especially a tungsten silicide film formed by CVD is patterned.

According to a first aspect of the present invention, the above object is attained by a method of forming a photoresist pattern, comprising the steps of: forming a metal silicide film on a substrate; etching a surface layer of the metal silicide; coating the metal silicide film with a photoresist so as to form a photoresist film on the etched surface layer of the metal silicide film; and patterning the photoresist film by photolithography.

Preferably, the etching of the surface layer of the metal silicide film is carried out with a liquid containing hydrogen peroxide in a predetermined concentration before the coating of the photoresist. The substrate is preferably a silicon substrate.

According to a second aspect of the invention, the method further includes the step of making the surface layer of the metal silicide film hydrophobic before the coating of the photoresist and subsequent to the etching of the surface layer of the metal silicide film.

Preferably, the step of making the surface layer of the metal silicide film hydrophobic is carried out by exposing the surface layer of the metal silicide film to hexamethyldisilazane atmosphere diluted with 1–50% of xylene.

As another preferable feature, the photoresist is a chemical amplification photoresist having a base resin, which is to be insoluble with an alkaline solvent when a protection radical is in a bonded state at a predetermined portion and to be soluble with the alkaline solvent when the protection radical is in a free state, and a photoionizer, which emits hydrogen ions upon exposure to light, the base resin being soluble with the alkaline solvent when the protection radical is freed in response to reaction of the hydrogen ions, which are emitted by said photoionizer, and the base resin.

According to a third aspect of the invention, the etching liquid contains at least ammonia, hydrogen peroxide and water.

The etching liquid may be an alternative liquid containing at least sulfuric acid and hydrogen peroxide.

As another alternative, the etching liquid may be a mixed liquid of hydrochloric acid and hydrogen peroxide or its diluted liquid.

As still another alternative, the etching liquid may be a mixed liquid of fluoric acid and hydrogen peroxide.

According to a fourth aspect of the invention, the metal silicide film is a tungsten silicide film.

As an alternative, the metal silicide film may be a titanium silicide film.

Preferably, the tungsten silicide film is formed of at least dichlorosilane ($SiH_2Cl_2$) and tungsten hexafluoride ($WF_6$) as raw material.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

Figure 1A:
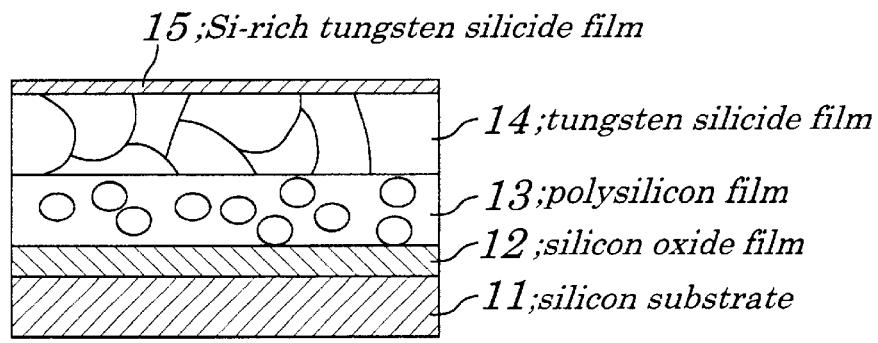
FIGS. 1(a) through 1(d) are cross-sectional diagrams of successive process steps of a photoresist pattern forming method according to a first embodiment of the present invention.

The principles of the present invention are particularly useful when applied to a photoresist pattern forming method, preferred embodiments of which will now be described in detail with reference to the accompanying drawings.

First Embodiment

FIGS. 1(a) through 1(d) are cross-sectional diagrams showing successive process steps of a photoresist pattern forming method according to a first embodiment of the present method.

The method of this embodiment comprises the steps of forming a tungsten silicide (WSi) film 14 on a silicon substrate (wafer) 11, coating the tungsten silicide film 14 with a chemical amplification photoresist to form a photoresist film 17 on the upper surface of the tungsten silicide film 14, and patterning the photoresist film 17 by photolithography. This method is far differentiated over the conventional method in that before coating the tungsten silicide film 14 with a chemical amplification photoresist and also before treating the tungsten silicide film 14 with hexamethyldisilazane, an upper layer of the tungsten silicide film 14 is etched with a liquid containing hydrogen peroxide in a predetermined concentration.

The photoresist pattern forming method of the first embodiment will now be described in further detail using FIGS. 1(a) through 1(d).

Firstly, a silicon oxide film 12 is formed on the silicon substrate 11 as by thermal oxidation, and then on the silicon oxide film 12, a polysilicon film 13 is formed in an approximate 100 nm thickness as by CVD. In this embodiment, during the formation of the polysilicon film 13, potassium is added to the polysilicon film 13 by in-situ doping. Alternatively, after the formation of the polysilicon film 13, potassium may be introduced into the polysilicon film 13 by potassium-diffusion or ion-implantation. Further, the potassium-contained polysilicon film 13 may be an amorphous silicon film formed using potassium-contained amorphous silicon as material; potassium may be added in situ during amorphous silicon growth or may be introduced into the amorphous silicon film by potassium-diffusion or ion implantation after formation of the amorphous silicon film.

Subsequently, on the upper surface of the polysilicon film 13, an approximate 110 nm thickness tungsten silicide film 14 is formed by CVD using tungsten hexafluoride and dichlorosilane as the main raw materials. During the formation of the tungsten silicide film 14, substantially likewise the conventional technology, in order to relax the internal stresses, supply of tungsten hexafluoride is terminated at the final stage of this film forming process, namely, only dichlorosilane is continued to be supplied, and as a result, an Si-rich tungsten silicide film 15 containing chlorine ions in a high concentration is inevitably formed on the tungsten silicide film 14 (FIG. 1(a)).

Then, the silicon substrate 11 formed on the upper surface of the multilayer film 12, 13, 14 is soaked in a mixed liquid of ammonia, hydrogen peroxide and water for approximately 10 minutes to remove the Si-rich tungsten silicide film 15 by etching. Preferably, this mixed liquid consists of approximate 29 weight % of aqueous ammonia, approximate 31 weight % of aqueous hydrogen peroxide and water, which are mixed at an approximate volume ratio of 1 (aqueous ammonia): 1 (aqueous hydrogen peroxide): 5 (water). Further, the liquid temperature during etching is preferably approximately 55° C., and in such event, the etching rate is approximately 1 nm per minute.

Figure 1B:
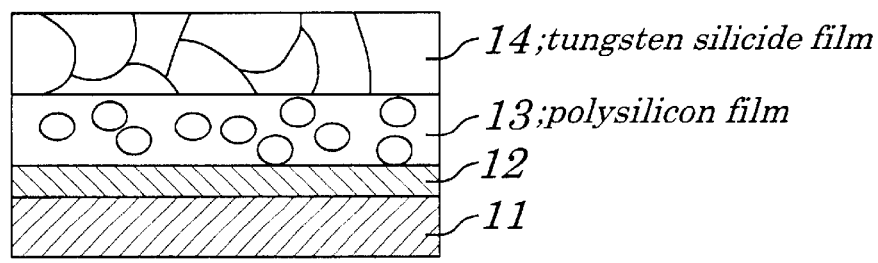

In this etching, not only the Si-rich tungsten silicide film 15 but also part (approximate 10 nm thickness) of the tungsten silicide film 14 are removed (FIG. 1(b)).

Figure 1C:
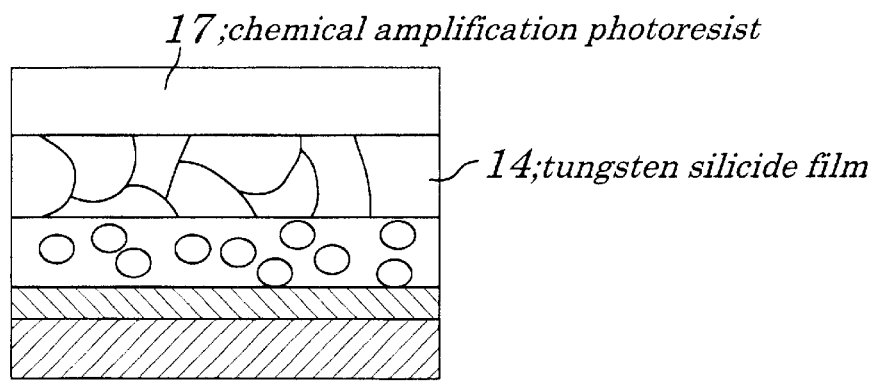
Figure 1D:
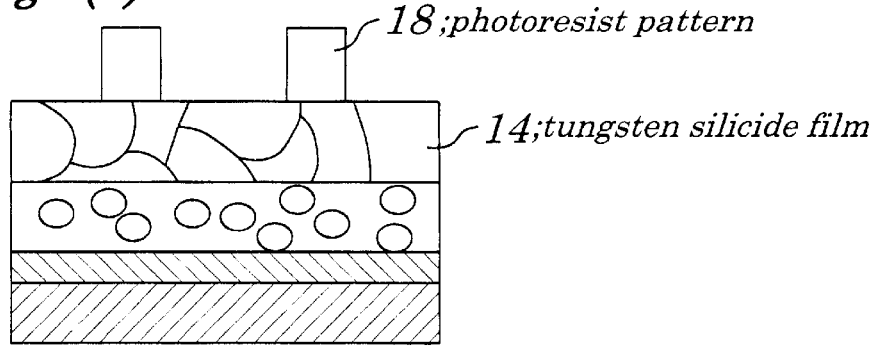

Then, a positive chemical amplification photoresist 17 is coated to the upper surface of the hexamethyldisilazane-treated tungsten silicide film 14 by a spinner (FIG. 1(c)), whereupon exposure takes place by irradiation as of KrF excimer laser and is followed by post exposure baking. Subsequently, alkali developing takes place to dissolve the irradiated portion of the chemical amplification photoresist film 17 with a developing liquid to form a photoresist pattern 18 on the tungsten silicide film 14 (FIG. 1(d)).

Figure 2A:
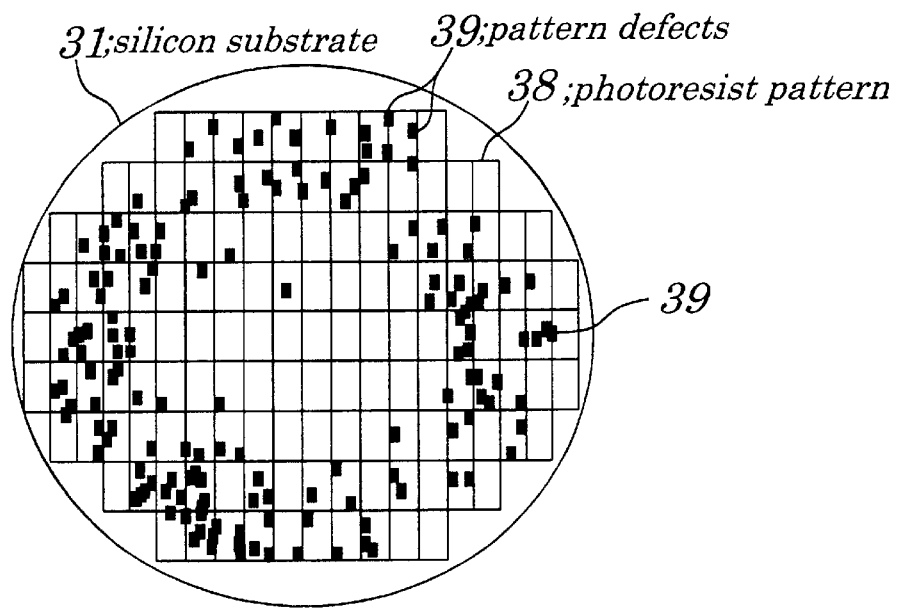
FIG. 2(a) is a diagram showing the distribution of defects of a conventional photoresist pattern on a silicon substrate which pattern was formed by a conventional method.
Figure 2B:
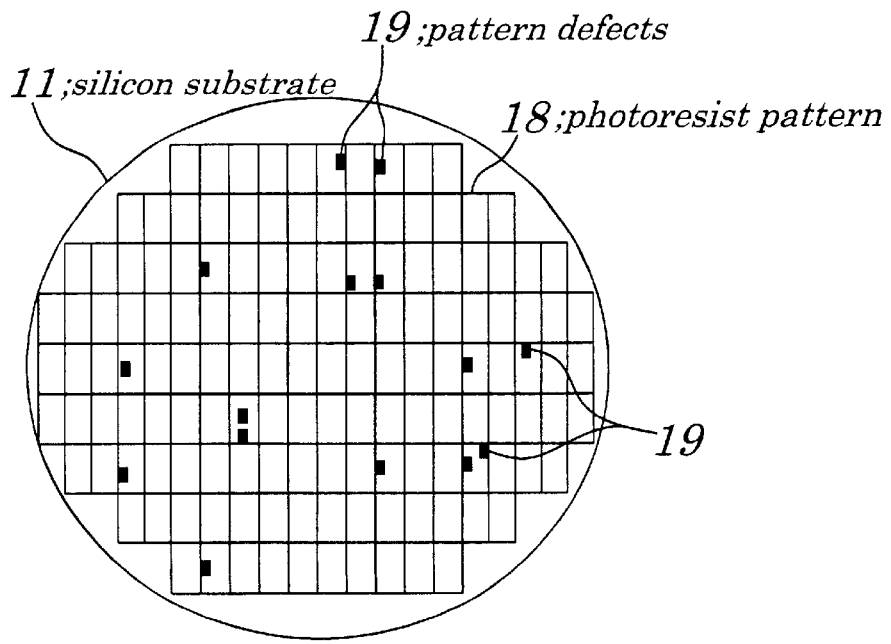
FIG. 2(b) is a diagram similar to FIG. 2(a), but showing the distribution of defects of an improved photoresist pattern formed by the present method.
Figure 3A:
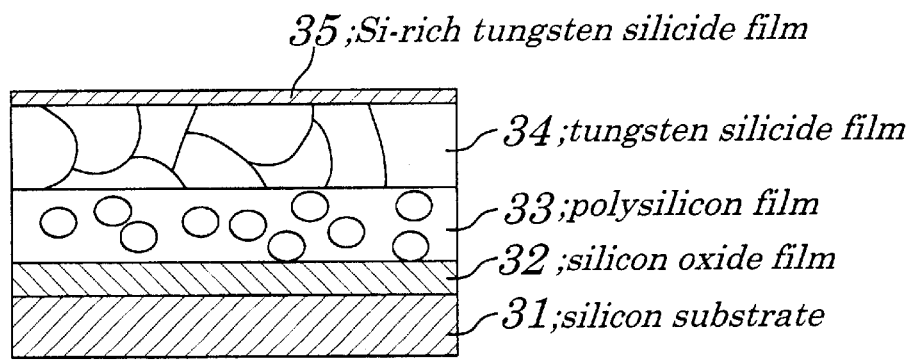
FIGS. 3(a) through 3(c) are cross-sectional diagrams of successive process steps of a conventional method of patterning a chemical amplification photoresist, illustrating the principle of the conventional technology.
Figure 3B:
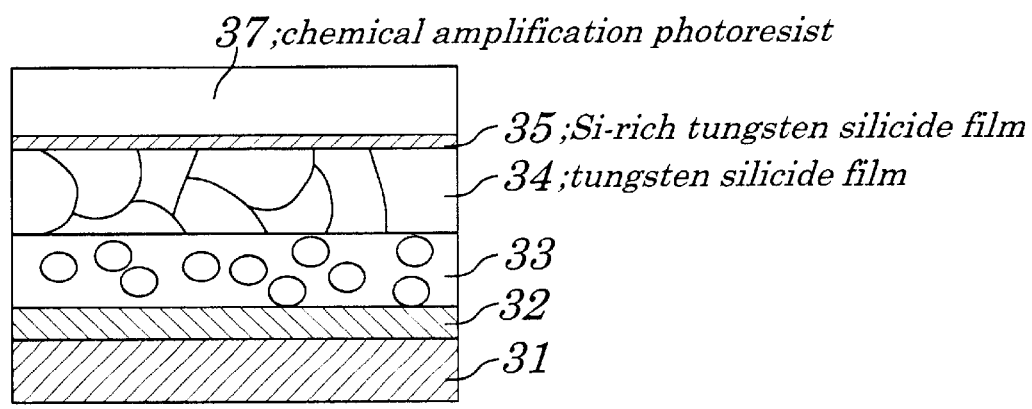
Figure 3C:
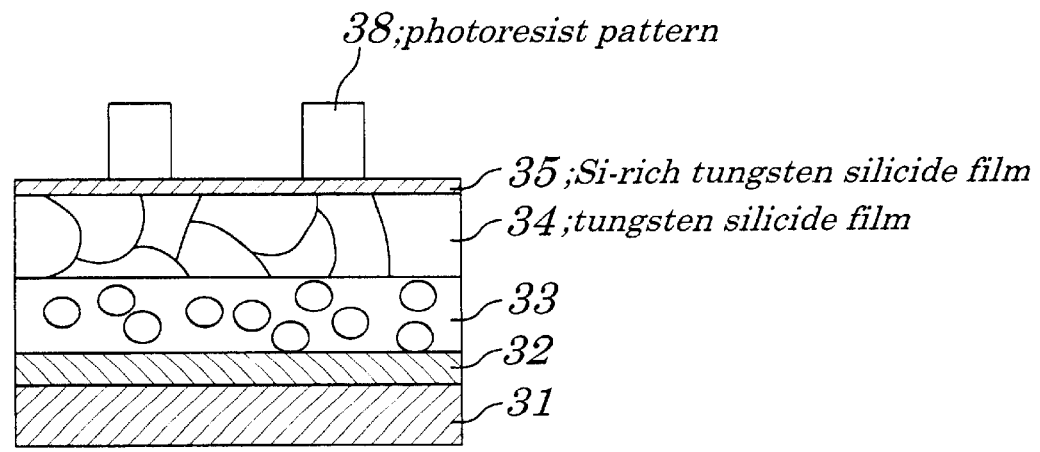
Figure 4A:
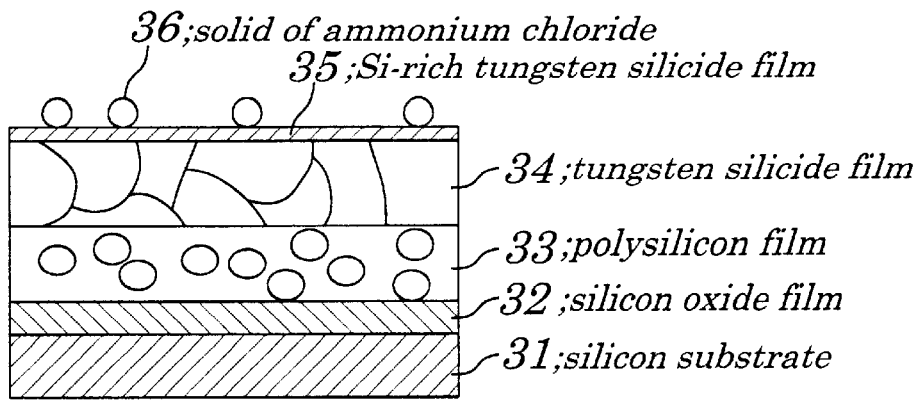
FIGS. 4(a) through 4(c) are cross-sectional process diagrams illustrating the problem of the conventional technology.
Figure 4B:
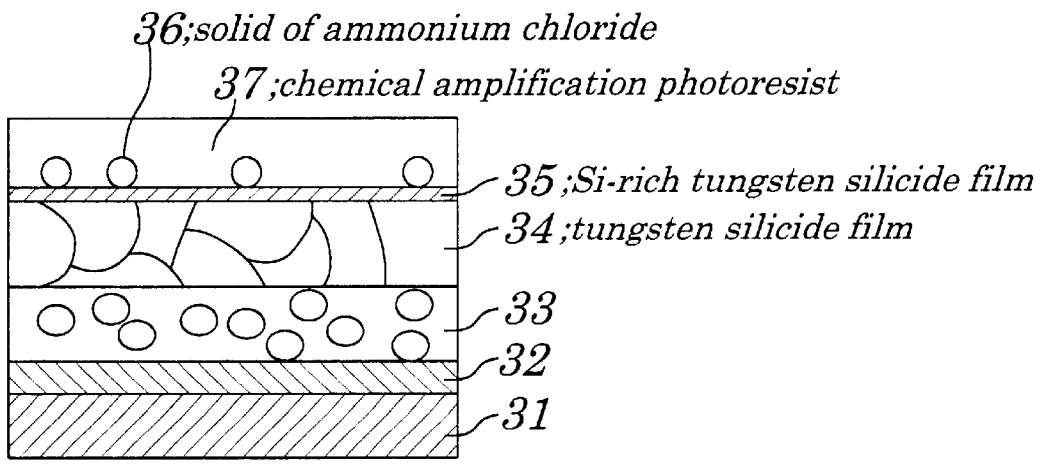
Figure 4C:
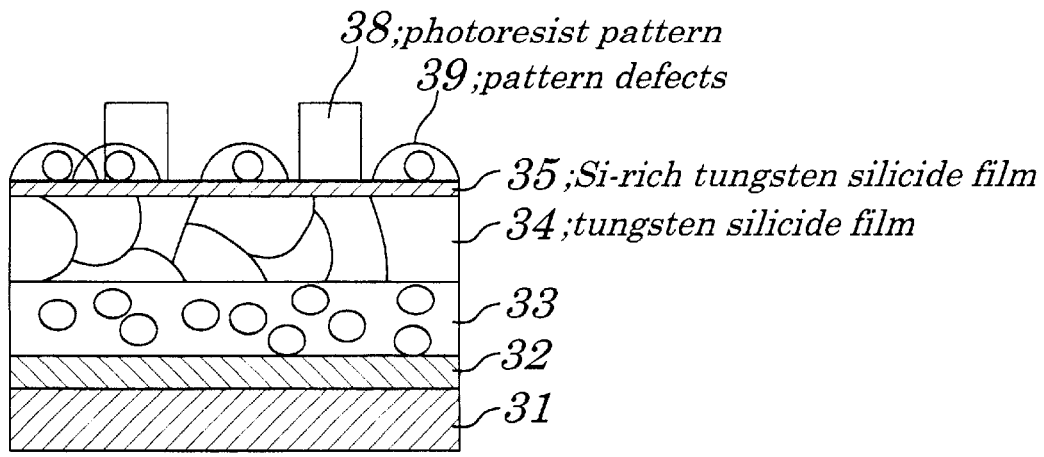

FIG. 2(a) is a diagram showing the distribution of photoresist pattern defects on the silicon substrate 31 according to the conventional method. It is probed from this diagram that a large number of pattern defects 39 occurred on the silicon substrate 31. FIG. 2(b) is a diagram showing the distribution of photoresist pattern defects on the silicon substrate 11 according to the method of the first embodiment. This diagram probes that the number of pattern defects 19 on the silicon substrate 11 was remarkably reduced as compared to that in the conventional method.

Thus, in the method of this embodiment, since the Si-rich tungsten silicide film 15 containing chlorine ions in a high concentration is removed by etching with a mixed liquid of aqueous ammonia, hydrogen peroxide and water before the hxamethyldisilazane treatment, any solid of ammonium chloride will not be formed on the upper surface of the tungsten silicide film 14. As a result, chlorine ions serving as a reaction starter are not captured by ammonium chloride so that the photoresist to be removed can be smoothly removed, thus preventing or relaxing possible pattern defects.

Since the rate of etching the tungsten silicide film 14 with the above-mentioned mixed liquid is approximately 1 nm per minute, which is very slow, as already mentioned, it is easy to monitor how this etching is going on, and the total etching thickness of the tungsten silicide film 14 can be allowed to approximately ⅓ of its thickness during the tungsten silicide film forming (e.g., approximately 50 nm if the thickness of the tungsten silicide film is approximately 150 nm during the CVD film forming), realizing well-controlled etching.

Second Embodiment

A second embodiment of the present method will now be described using FIGS. 1(a) through 1(d).

The method of this embodiment is similar to that of the first embodiment except that as the etching liquid for removing the Si-rich tungsten silicide film 15, a mixed liquid of sulfuric acid and hydrogen peroxide is used in place of the mixed liquid of aqueous ammonia, hydrogen peroxide and water.

In the second embodiment, it is preferable that this mixed liquid consists of approximate 95 weight % of sulfuric acid and approximate 31 weight % of aqueous hydrogen peroxide, which are mixed at an approximate volume ratio of 5 (sulfuric acid): 1 (aqueous hydrogen peroxide). Further, the liquid temperature during etching is preferably approximately 140° C., and in such event, the etching rate is approximately 0.1 nm per minute.

If the silicon substrate 11 on the upper surface of which the multilayer film 12, 13, 14 are formed is soaked for approximately 140° C. minutes in this mixed liquid whose temperature is approximately 140° C., not only the Si-rich tungsten silicide film 15 but also part (approximate 2 nm thickness) of the tungsten silicide film 14 are removed.

According to the method of the second embodiment, the advantageous results substantially similar to those of the first embodiment can be achieved.

Additionally, according to the second embodiment, the rate of etching the tungsten silicide film 14 is remarkably slow as compared to the first embodiment. As a result, it is much easier to grasp how the etching is going on so that reduction of thickness of the tungsten silicide film 14 by etching can be restricted, realizing much better-controlled etching. Therefore, much better uniformity of the tungsten silicide film 14 can be achieved in both the unremoved film thickness and the sheet resistance through the entire surface of the silicon substrate 11 as compared to the first embodiment.

The prevent invention should by no means be limited to the foregoing embodiments and various modifications and changes may be suggested without departing from the scope and sprint of the invention. For example, either of the mixing ratio of aqueous ammonia, hydrogen peroxide and water and the mixing ratio of sulfuric acid and hydrogen peroxide may be changed as demand arises. The liquid temperature also may be changed. Further, the etching method is not limited to soaking.

Further, in the foregoing embodiments, the mixed liquid of aqueous ammonia, hydrogen peroxide and water or the mixed liquid of sulfuric acid is used for etching the upper layer of the tungsten silicide film well-controllably at a low etching rate before coating the photoresist. Alternative preferable etching liquids are exemplified by a mixed liquid of hydrochloric acid and hydrogen peroxide or its diluted liquid, a mixed liquid of fluoric acid and hydrogen peroxide or its diluted liquid, and hydrogen peroxide solely or its diluted liquid. Namely, as long as it contains hydrogen peroxide, any etching liquid is preferable very much.

Further, if the etching is carried out in a processing bath equipped with an ultrasonic oscillator, it is possible to prevent foreign matter from adhering again to the surface of the tungsten silicide film, realizing much effective prevention of pattern defects.

Furthermore, the photoresist is not limited to a chemical amplification photoresist, which is either a positive type or a negative type.

Additionally, in the foregoing embodiments, a photoresist pattern is formed on the tungsten silicide film. Alternatively, a photoresist pattern may be formed on another metal silicide such as titanium silicide (TiSi). Also, the metal silicide film is not limited to the one formed by CVD, and the substrate is not limited to a silicon substrate.

As is mentioned above, according to the photoresist pattern forming method of the present invention, since the upper layer of a metal silicide film containing chloride ions in a high concentration is removed using an etching liquid containing hydrogen peroxide before coating the photoresist, any solid of ammonium chloride will not be formed on the upper surface of the metal silicide film. As a result, chlorine ions serving as a reaction starter are not captured by ammonium chloride so that the photoresist to be removed can be smoothly removed, thus preventing or relaxing possible pattern defects.

It is thus apparent that the present invention is not limited to the above embodiments but may be changed and modified without departing from the scope and spirit of the invention.

Finally, the present application claims the priority of Japanese Patent Application No. Hei10-017064 filed on Jan. 29, 1998, which is herein incorporated by reference.

What is claimed is:

1. A method of forming a photoresist pattern, comprising the steps:

(a) forming a first metal silicide film on a substrate;

(b) forming a second metal silicide film on the first metal silicide film, wherein the second metal silicide film is a silicon rich tungsten silicide film;

(c) etching of the second metal silicide film, wherein the second metal silicide film and a portion of the first metal silicide film are removed;

(d) making the resulting surface layer of the first metal silicide film hydrophobic;

(e) then coating the first metal silicide film with a photoresist so as to form a photoresist film on the etched surface layer of the first metal silicide film; and (f) patterning the photoresist film by photolithography; and (g) wherein said etching of the surface layer of the metal silicide film is carried out with a liquid containing hydrogen peroxide before said coating of the photoresist;

(h) wherein said step of making the surface layer of the metal silicide film hydrophobic is carried out by exposing the surface layer of the metal silicide film to hexamethyldisilazane atmosphere diluted with xylene;

(i) wherein said photoresist is a chemical amplification photoresist having a base resin, which is to be insoluble with an alkaline solvent when a protection radical is in a bonded state at a predetermined portion and to be soluble with the alkaline solvent when the protection radical is in a free state, and a photoionizer, which emits hydrogen ions upon exposure to light, said base resin being soluble with the alkaline solvent when said protection radical is freed in response to reaction of the hydrogen ions, which are emitted by said photoionizer, and said base resin; and (j) wherein said first metal silicide film is tungsten silicide film; and (k) wherein said tungsten silicide film is formed of at least dichlorosilane ($SiH_2Cl_2$) and tungsten hexafluoride ($WF_6$) as raw material.

2. A method according to claim 1, wherein said substrate is a silicon substrate.

3. A method according to claim 1, wherein said liquid contains at least ammonia, hydrogen peroxide and water.

4. A method according to claim 1, where said liquid contains at least sulfuric acid and hydrogen peroxide.

5. A method according to claim 1, wherein said liquid is a mixed liquid of hydrochloric acid and hydrogen peroxide or its diluted liquid.

6. A method according to claim 1, wherein said liquid is a mixed liquid of fluoric acid and hydrogen peroxide.

* * * * *